(12) United States Patent
Casier et al.

(10) Patent No.: US 6,529,071 B2
(45) Date of Patent: Mar. 4, 2003

(54) XDSL FEEDBACK CLASS C-AB DRIVER

(75) Inventors: Herman Joris Casier, Kuurne (BE); Joannes Mathilda Josephus Sevenhans, Brasschaat (BE); Elvé Desiderius Jozef Moons, Lummen (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/026,655

(22) Filed: Dec. 27, 2001

(65) Prior Publication Data

US 2002/0084774 A1 Jul. 4, 2002

(30) Foreign Application Priority Data

Dec. 28, 2000 (EP) .............................. 00403693

(51) Int. Cl.[7] .............................. H03F 1/36; H03F 1/38
(52) U.S. Cl. ........................................ 330/85; 330/291
(58) Field of Search ................................ 323/266, 268; 330/69, 85, 90, 110, 252, 291

(56) References Cited

U.S. PATENT DOCUMENTS

| | | | |
|---|---|---|---|
| 3,873,936 A | | 3/1975 | Cho |
| 4,523,152 A | | 6/1985 | Garde |
| 5,825,244 A | * | 10/1998 | Somayajula ................ 330/253 |
| 5,930,128 A | | 7/1999 | Dent |
| 6,281,751 B1 | * | 8/2001 | Maulik ........................ 330/255 |
| 6,374,043 B1 | * | 4/2002 | El-Sherif et al. ......... 388/907.2 |

OTHER PUBLICATIONS

Nam–Sung Jung, Et Al.: "A New High–Efficiency and Super–Fidelity Analog Audio Amplifier with the aid of Digital Switching Amplifier: Class K Amplifier", Dept,. Of Electrical Engineering, Korea Advanced Institute of Science and Technology (KAIST), IEEE publication, 1998, pp. 457–463, Korea.

"Basic Considerations and Topologies of Switched–Mode assisted Linear Power Amplifiers", IEEE transactions on Industrial Electronics, vol. 44, No. 1, Feb. 1997, pp. 116–123.

"A Design of a 10–W Single–Chip Class D Audio Amplifier with Very High Efficiency using CMOS Technology", IEEE Transactions on Consumer Electronics, vol. 45, No. 3, Aug. 1999, pp. 465–473.

* cited by examiner

*Primary Examiner*—Matthew Nguyen
(74) *Attorney, Agent, or Firm*—Sughrue Mion, PLLC

(57) ABSTRACT

The present invention is related to a Line driver for amplifying an input signal, said line driver comprising: a first input terminal (11) for receiving said input signal, a non-linear amplifier (3) connected to said input terminal (11) and arranged to provide a first output signal at a first output terminal (13), a digital to analogue converter (15) arranged to transform said input signal to an analogue input signal, an analogue linear amplifier (5) comprising a second (6) and a third input terminal (8) and a second output terminal (10), set up as a comparator between a first correction signal provided at said second input terminal (6) and a second correction signal provided at said third input terminal (8) and arranged to provide a second output signal at said second output terminal (10), combining means arranged to combine said first output signal and said second output signal to provide a total output signal to an output line (7), a first operational amplifier (12) configured to sense the current of said total output signal and arranged to provide a third output signal at fourth output terminal (16), said third output signal being based on said current and the impedance of the output line, and a second operational amplifier (14) arranged to subtract said third output signal from said analogue input signal to provide a fourth output signal, wherein said first correction signal is the total output signal and the second correction signal is said fourth output signal.

10 Claims, 2 Drawing Sheets

XDSL FEEDBACK CLASS C-AB DRIVER

FIELD OF THE INVENTION

The present invention is related to a novel line driver for applications such as ADSL (Asymmetric Digital Subscriber Line) or VDSL (Very High Speed Digital Subscriber Line).

STATE OF THE ART

In the design of line drivers for applications such as ADSL (Asymmetric Digital Subscriber Line) or VDSL (Very High Speed Digital Subscriber Line), power consumption is a critical issue and signal linearity requirements are stringent. Manufacturers are continually looking for solutions to decrease power consumption. At the moment, the DSL chip market is estimated at 50 million chip sets for 2000 (total value of more than 1 billion USD in 2000).

A traditional class AB driver consumes about 1.3 Watt to produce an output signal of 100 mWatt. The power consumption of the class AB driver may be reduced by about 100 mWatt/$\eta$ (where $\eta$ is the efficiency of the amplifier which typically has a value between 0.05 and 0.10) through use of an active back termination. Such an active back terminated line driver is described in EP-A-0901221.

A class G driver can also be used, including switches and circuitry to monitor the crest factor of the transmitted signal and to appropriately switch between two power supply levels.

A traditional switch mode driver (SW-DRIVER), which consists of a $\Sigma\Delta$-modulator ($\Sigma\Delta$), circuitry (SW) to monitor the crest factor of the transmitted signal and to appropriately switch between different power supply levels, a low pass filter (Fl) and a hybrid (HY), less power as digital technology proceeds to deeper submicron technologies. Such a switch mode driver for instance is shown in FIG. 1b of "Basic considerations and topologies of switched-mode assisted linear power amplifiers", IEEE transactions on Industrial Electronics, Vol. 44 No.1 pp 116–123, February 1997. Power consumption is optimized through switching between the different power supply levels. In an improved version of the switch mode driver (SW-DRIVER), the crest factor is monitored in the hybrid (HY). The power consumption may even be further reduced by about 100 mWatt/$\eta$ ($\eta$ being the efficiency of the amplifier) through use of active back termination.

A switch mode amplifier (digital amp.) in parallel with a linear amplifier (analog amp.) each producing part of an outputted audio signal is disclosed in FIG. 4 of "A New High-Efficiency and Super-Fidelity Analog Audio Amplifier with the aid of Digital Switching Amplifier: Class K Amplifier", (IEEE publication, Nam-Sung Jung, Nam-In Kim and Gyu-Hyeong Cho, 1998) and in WO 98/37731. In the class K amplifier, the linear amplifier (analog amp.) is an independent source, whereas the switch mode amplifier (digital amp.) is controlled by the voltage sensed over the resistor $R_{sense}$ and consequently is dependent on the current source by the linear amplifier (analog amp.). Also FIG. 2 of "Basic considerations and topologies of switched-mode assisted linear power amplifiers", IEEE transactions on Industrial Electronics, Vol. 44 No.1 pp 116–123, February 1997 and FIG. 3 of "A Design of a 10-W Single-Chip Class D audio amplifier with Very High Efficiency using CMOS Technology", IEEE Transactions on Consumer Electronics, Vol. 45, No.3, pp 465–473, August 1999 show switched-mode assisted linear amplifiers with a structure and functionality similar to that of the class K amplifier of "A New High-Efficiency and Super-Fidelity Analog Audio Amplifier with the aid of Digital Switching Amplifier: Class K Amplifier", already cited above.

The switching mode line driver is the most power efficient line driver, but is very sensitive for power supply variations (low power supply rejection) and clock jitter. This results in errors in the transmitted signal.

AIMS OF THE INVENTION

The present invention aims to provide a novel line driver which is linear, stable, and efficient. The output of said driver should be free of errors due to power supply variations and clock jitter.

SUMMARY OF THE INVENTION

The present invention comprises in a first aspect a line driver for amplifying an input signal, said line driver comprising:

a first input terminal for receiving said input signal, a non-linear amplifier connected to said input terminal and arranged to provide a first output signal at a first output terminal, a digital to analogue converter arranged to transform said input signal to an analogue input signal, an analogue linear amplifier comprising a second and a third input terminal and a second output terminal, set up as a comparator between a first correction signal provided at said second input terminal and a second correction signal provided at said third input terminal and arranged to provide a second output signal at said second output terminal, combining means arranged to combine said first output signal and said second output signal to provide a total output signal to an output line, a first operational amplifier configured to sense the current of said total output signal and arranged to provide a third output signal at fourth output terminal, said third output signal being based on said current and the impedance of the output line, and a second operational amplifier arranged to subtract said third output signal from said analogue input signal to provide a fourth output signal, wherein said first correction signal is the total output signal and the second correction signal is said fourth output signal.

Preferably, the proportion of the first output signal in the total output signal is at least 95%.

The line driver of the present invention can be further characterised in that the non-linear amplifier is selected from the group consisting of switching mode amplifiers, clipping amplifiers, G, B or K-class amplifiers and pulse modulation amplifiers, and in that the linear amplifier is selected from the group consisting of class A and AB amplifiers.

The combining means preferably comprise a hybrid.

The input signal can be generated by a DMT.

In a preferred embodiment, the line driver of the present invention further comprises an active back termination circuit.

A second aspect of the present invention comprises a method for amplifying an input signal, comprising the following steps:

providing a line driver according to the present invention, feeding said line driver at the input terminal with said input signal, a first amplifying step, comprising amplifying said input signal with the non-linear amplifier and providing the first output signal at the first output terminal, a second amplifying step, performed in parallel with said first amplifying step and comprising a digital to analogue conversion of the input signal to an analogue input signal, sensing the current of the total output signal and the impedance of the output line with a first operational amplifier to provide a third output signal, comparing said analogue input signal with said third output signal using a second operational amplifier to provide a fourth output signal, and comparing said fourth output signal with said total output signal using an analogue linear amplifier, providing a second output signal at the second output terminal, and a combination step comprising combining said first output signal with said second output signal to obtain the total output signal to the output line.

Said combination step can be performed using a hybrid. The input signal can be generated by a DMT.

SHORT DESCRIPTION OF THE DRAWINGS

DETAILED DESCRIPTION OF THE INVENTION

Figure 2:
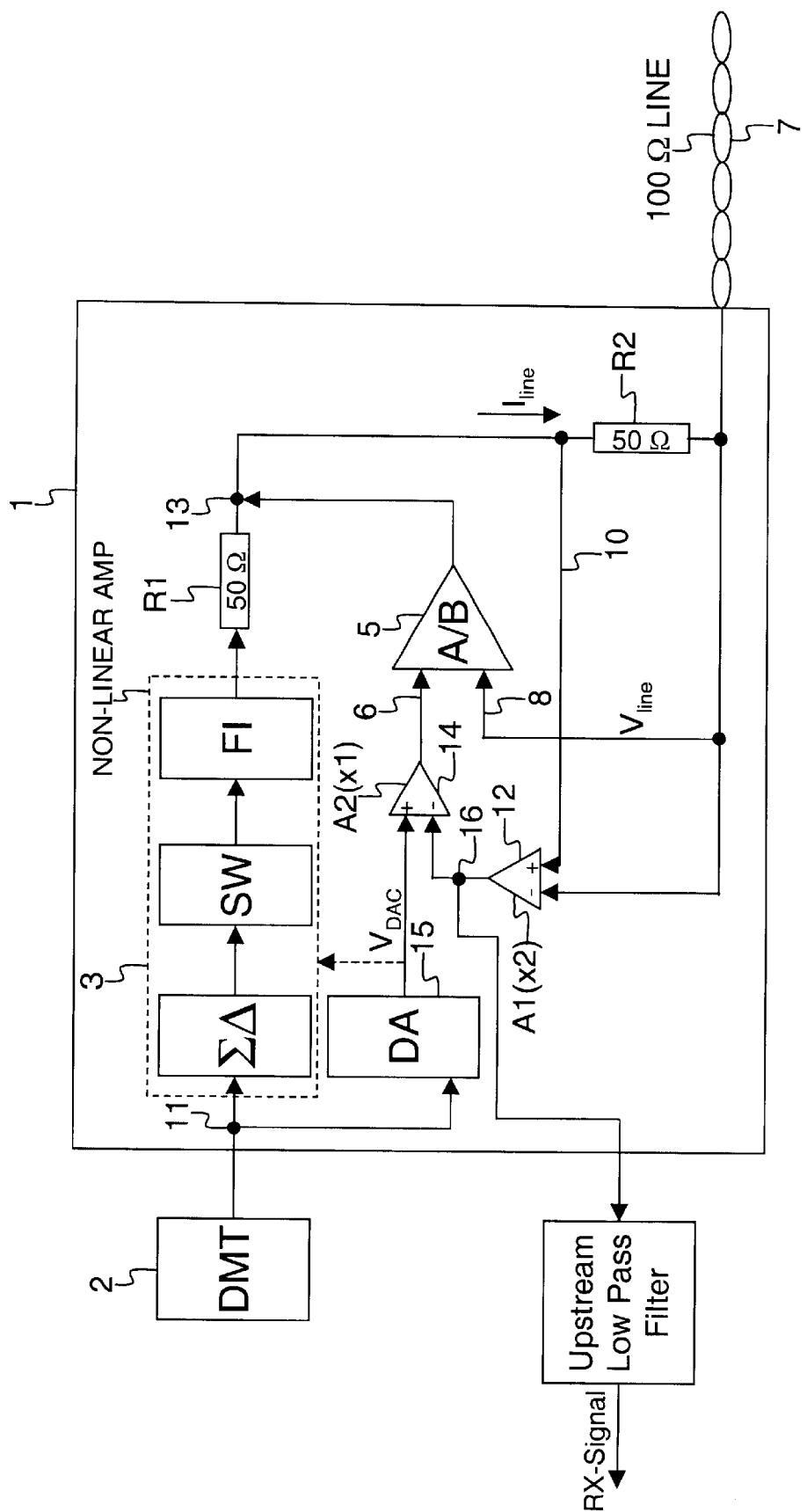
FIG. 2 represents a feedback Class C-AB line driver according to the present invention.

A feedback class C-AB line driver 1 according to the present invention comprises a traditional non-linear amplifier 3 that produces about 95% of the required output signal power. In parallel with the non-linear amplifier 3, the feedback class C-AB line driver 5 comprises a analogue linear amplifier 5 that produces about 5% of the required output signal power. The feedback class C-AB line driver 1 thereto contains a feedback circuit with a first opamp (A1) 12 that senses the line current ($I_{line}$) a second opamp (A2) 14 that subtracts the line current ($I_{line}$) multiplied by the line impedance (100Ω in the case of FIG. 2) from the digital to analogue converted input signal ($V_{DAC}$) of the feedback class C-AB line driver 1. The difference signal ($V_{DAC}$-$I_{line}$X 100Ω) at the output of the second opamp 14 is compared by the linear amplifier 5 with the voltage level ($V_{line}$) of the output signal, and the difference is compensated for by the linear amplifier 5.

The signals produced by the non-linear amplifier 3 and the linear amplifier 5 are combined into the total output signal.

The feedback circuit can be integrated with an active back termination.

By feeding back the signal on the line to the linear amplifier, the linear amplifier can more accurately compensate for the differences between the signal produced by the non-linear and the required output signal than a linear amplifier with feedforward architecture can do, mainly in relation to line impedance variations and component tolerances.

The linear amplifier, apart from power supply variations and clock jitter, also compensates for distortion, e.g. due to clipping of the non-linear amplifier.

A 3rd order/4th order RC or LC filter (Fl) is required to limit the band to 1 Mhz when using a switching mode amplifier as the non-linear amplifier.

DESCRIPTION OF A PREFERRED EMBODIMENT OF THE INVENTION

Figure 1:
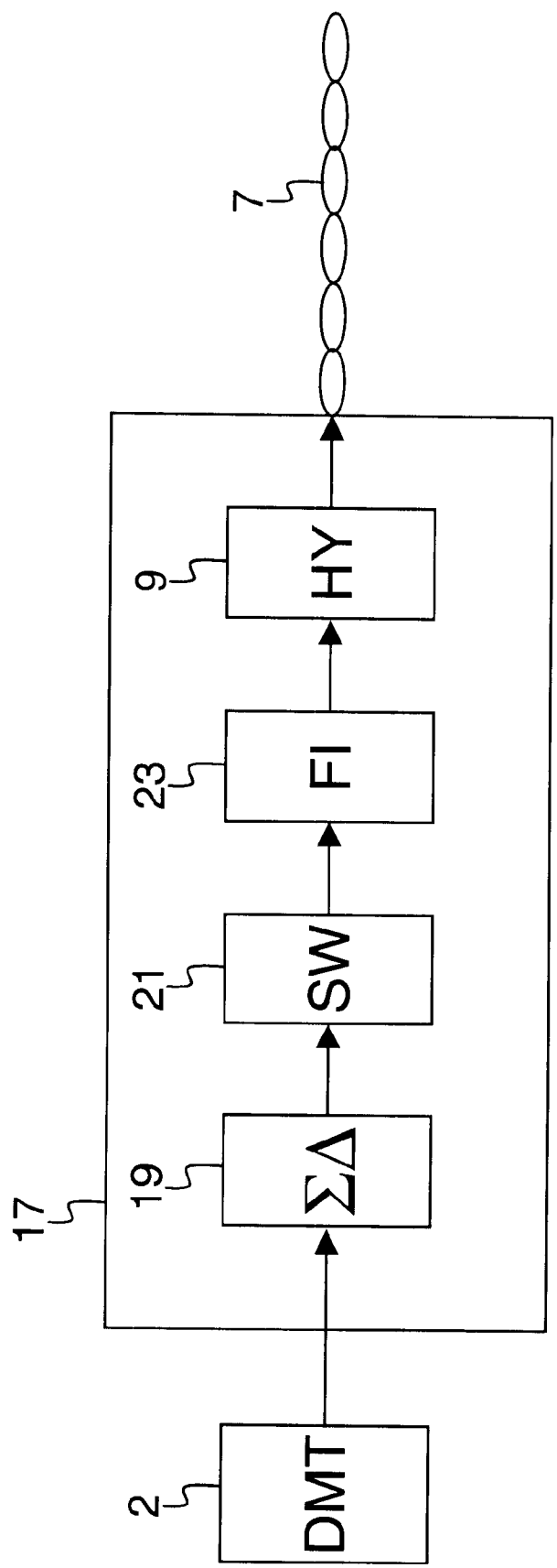
FIG. 1 shows a switching mode line driver as known from the prior art.

In a preferred embodiment, the non-linear amplifier in the feedback line driver of the present invention is a traditional switching mode line driver as in FIG. 1. As the switching mode line driver is the most power efficient line driver, this embodiment is very advantageous. The linear amplifier is a class A/B amplifier.

Such a feedback C-AB line driver can comprise an active back termination to diminish power consumption even more.

The distortion due to power supply changes and clock jitter is reduced by the loop gain of the class A/B correction loop in comparison with the traditional switching mode line driver.

An additional advantage with the class C-AB line driver according to the invention is that power supply can be simplified compared to the traditional G-class amplifier. A class G amplifier needs GND (ground), +Vcc, +Vcc/2, −Vcc and −Vcc/2 potentials. The non-linear and linear amplifier of the class C-AB line driver according to the invention only need +Vcc, −Vcc and GND connections. DC-de-coupling capacitors, inserted at the output of the non-linear amplifier are useful to avoid power supply asymmetry effects when driving the line with two non-linear amplifiers.

What is claimed is:

1. Line driver for amplifying an input signal, said line driver comprising:

a first input terminal (11) for receiving said input signal, a non-linear amplifier (3) connected to said input terminal (11) and arranged to provide a first output signal at a first output terminal (13), a digital to analogue converter (15) arranged to transform said input signal to an analogue input signal, an analogue linear amplifier (5) comprising a second (6) and a third input terminal (8) and a second output terminal (10), set up as a comparator between a first correction signal provided at said second input terminal (6) and a second correction signal provided at said third input terminal (8) and arranged to provide a second output signal at said second output terminal (10), combining means arranged to combine said first output signal and said second output signal to provide a total output signal to an output line (7), a first operational amplifier (12) configured to sense the current of said total output signal and arranged to provide a third output signal at fourth output terminal (16), said third output signal being based on said current and the impedance of the output line, and a second operational amplifier (14) arranged to subtract said third output signal from said analogue input signal to provide a fourth output signal, wherein said first correction signal is the total output signal and the second correction signal is said fourth output signal.

2. Line driver as in claim 1, characterised in that the proportion of the first output signal in the total output signal is at least 95%.

3. Line driver as in claim 1, characterised in that the non-linear amplifier (3) is selected from the group consisting of switching mode amplifiers, clipping amplifiers, G,B or K-class amplifiers and pulse modulation amplifiers.

4. Line driver as in claim 1, characterised in that the linear amplifier (5) is selected from the group consisting of class A and AB amplifiers.

5. Line driver as in claim 1, characterised in that the combining means comprise a hybrid (9).

6. Line driver as in claim 1, characterised in that the input signal is generated by a DMT (2).

7. Line driver as in claim 1, characterised in that it further comprises an active back termination circuit.

8. A method for amplifying an input signal, comprising the following steps:
- providing a line driver (1) such as in claim 1,
- feeding said line driver (1) at the input terminal (11) with said input signal,
- a first amplifying step, comprising amplifying said input signal with the non-linear amplifier (3) and providing the first output signal at the first output terminal (13),
- a second amplifying step, performed in parallel with said first amplifying step and comprising a digital to analogue conversion of the input signal to an analogue input signal, sensing the current of the total output signal and the impedance of the output line with a first operational amplifier to provide a third output signal, comparing said analogue input signal with said third output signal using a second operational amplifier to provide a fourth output signal, and comparing said fourth output signal with said total output signal using an analogue linear amplifier (5), providing a second output signal at the second output terminal (10), and
- a combination step comprising combining said first output signal with said second output signal to obtain the total output signal to the output line (7).

9. The method as in claim 8, characterised in that said combination step is performed using a hybrid (9).

10. The method as in claim 8, characterised in that the input signal is generated by a DMT (2).

* * * * *